(12) United States Patent
Tresness et al.

(10) Patent No.: US 6,888,423 B2
(45) Date of Patent: May 3, 2005

(54) ELECTRONIC FILTER ASSEMBLY

(75) Inventors: Andrew F. Tresness, Manlius, NY (US); Martin L. Zelenz, Fayetteville, NY (US); Jerry M. Gould, Liverpool, NY (US)

(73) Assignee: Arrow Communication Laboratories, Inc., Syracuse, NY (US)

( * ) Notice: Subject to any disclaimer, the term of this patent is extended or adjusted under 35 U.S.C. 154(b) by 0 days.

(21) Appl. No.: 10/721,492

(22) Filed: Nov. 25, 2003

(65) Prior Publication Data

US 2004/0104788 A1 Jun. 3, 2004

Related U.S. Application Data

(63) Continuation of application No. 09/898,543, filed on Jun. 29, 2001, now Pat. No. 6,674,343, which is a continuation of application No. 09/382,064, filed on Aug. 24, 1999, now Pat. No. 6,323,743.

(51) Int. Cl.[7] .................................................. H03H 7/01
(52) U.S. Cl. ........................................ 333/185; 333/175
(58) Field of Search ................................. 333/167, 168, 333/172, 175, 176, 185, 206

(56) References Cited

U.S. PATENT DOCUMENTS

| | | | |
|---|---|---|---|
| 4,097,894 A | 6/1978 | Tanner et al. ............... 380/208 |
| 4,451,803 A | 5/1984 | Holdsworth .................. 333/12 |
| 4,701,726 A | 10/1987 | Holdsworth ................ 333/185 |
| 4,890,199 A | 12/1989 | Beutler ....................... 361/818 |
| 4,901,043 A | 2/1990 | Palinkas .................... 333/175 |
| 4,945,323 A | 7/1990 | Gerstenberg et al. ....... 333/185 |
| 5,150,087 A | 9/1992 | Yoshie et al. ............... 333/185 |
| 5,278,525 A | 1/1994 | Palinkas .................... 333/175 |
| 5,432,488 A | 7/1995 | Kotani et al. ............... 333/167 |
| 5,668,408 A | 9/1997 | Nicholson ................... 257/699 |
| 5,906,512 A | 5/1999 | Reynolds .................... 439/579 |
| 6,636,129 B2 * | 10/2003 | Zennamo et al. ........... 333/176 |
| 6,737,935 B1 * | 5/2004 | Shafer ........................ 333/132 |

OTHER PUBLICATIONS

Tractec Holland Low Pass Filter, Type LPF–250, Photos 1 through 4. (1987).
Tractec Holland High Pass Filter, Type HPF 88, Photos 1 through 3. (1987).
Arcom Saw Negative Trap CATV Filter, Channel 7, Photos 1 through 5 (1998).

* cited by examiner

Primary Examiner—Robert Pascal
Assistant Examiner—Dean Takaoka
(74) Attorney, Agent, or Firm—Lawrence P. Trapani

(57) ABSTRACT

An electronic filter assembly comprises a housing, first and second circuit board surfaces, first and second cable TV filter circuits, a ground plane, and first and second electrical terminals. The housing includes first and second cable connectors in opposed relation to each other and contains an interior volume. The circuit board surfaces are in superposed relation to each other and engage the housing within the interior volume. The circuit board surfaces face away from each other in opposite directions. The cable TV filter circuits are mounted on the circuit board surfaces, respectively. The ground plane is disposed between the circuit board surfaces. The ground plane contacts the filter housing within the interior volume. The electrical terminals are coupled to the filter circuits. The first terminal extends into and is supported inside the first cable connector, and the second terminal extends into and is supported inside the second cable connector.

7 Claims, 3 Drawing Sheets

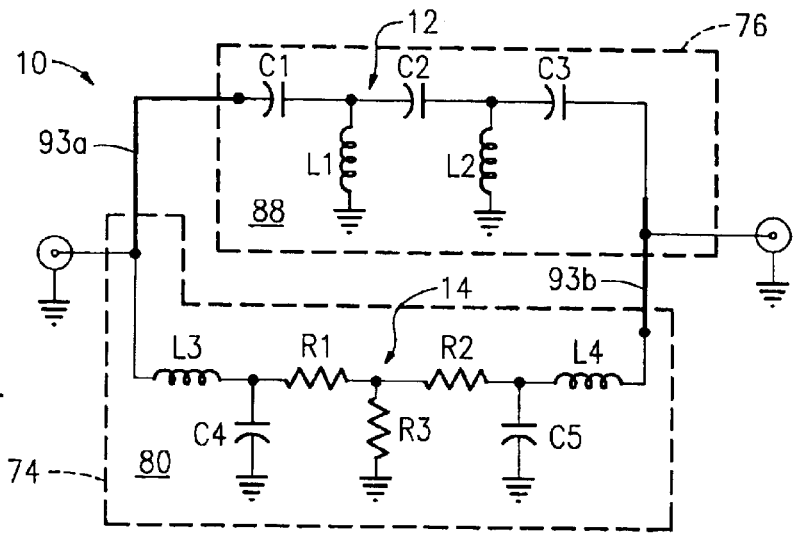
FIG.1
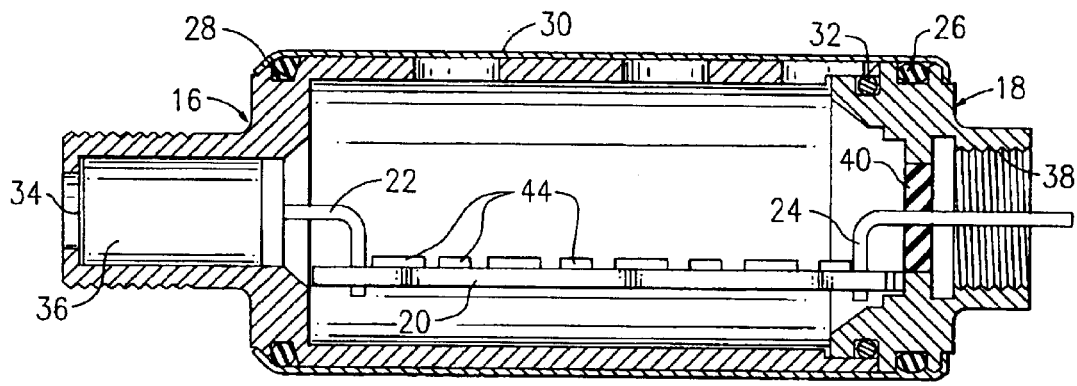
FIG.2
Prior Art
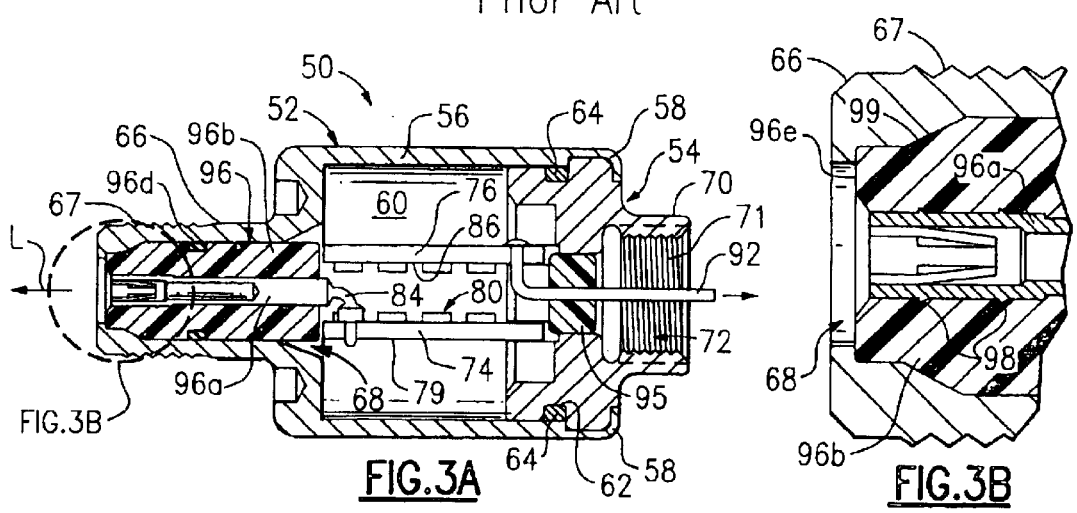
FIG.3A
FIG.3B

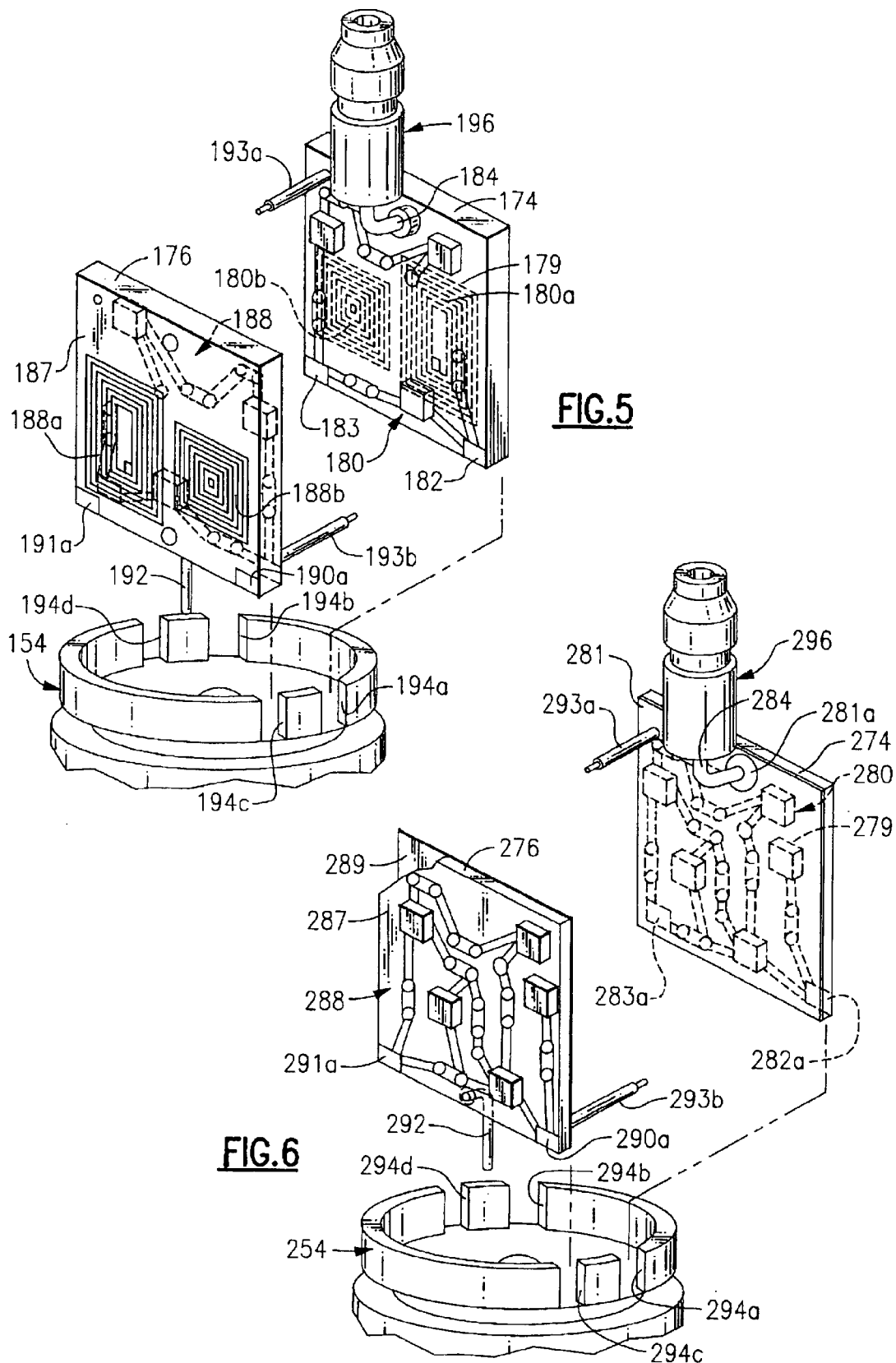

ELECTRONIC FILTER ASSEMBLY

CROSS-REFERENCE TO RELATED APPLICATIONS

This is a continuation of application Ser. No. 09/898,543, filed Jun. 29, 2001, now U.S. Pat. No. 6,674,343, which is a continuation of application Ser. No. 09/382,064, filed Aug. 24, 1999 now U.S. Pat. No. 6,323,743.

BACKGROUND OF THE INVENTION

1. Technical Field

The present invention relates generally to electronic filters used in the cable television industry, and relates more particularly to the construction and assembly of such filters.

2. Background Art

Typical electronic filter constructions in the cable television (CATV) industry involve a considerable number of parts, such as, for example, one or more circuit boards, connecting wires or leads, filter circuit components, isolation plates, blocks or chambers, input and output terminals, moisture barrier seals or plugs, connector housings, sub-housings or caps, o-rings, outer housing sleeves, and potting material. This elaborate array of parts constrains efforts to: minimize the size and weight of the filters; reduce material and labor costs associated with assembly of the filters; and simplify and automate the assembly process. Examples of such filter constructions are shown and described in: U.S. Pat. No. 5,278,525 to Palinkas; U.S. Pat. No. 4,901,043 to Palinkas; U.S. Pat. No. 4,701,726 to Holdsworth; U.S. Pat. No. 4,451,803 to Holdsworth et al; U.S. Pat. No. 3,579,156 to Parfitt; and U.S. Pat. No. 3,065,434 to Calderhead.

For such CATV filters as highpass and lowpass filters, diplex filters, windowed highpass filters, and step attenuator (or return path) filters, tunable filter circuits and shielding between filter components and circuits are not normally required. Thus, for these types of filters, an opportunity is presented to simplify filter components, construction and assembly. U.S. Pat. No. 5,745,838 to Tresness et a. discloses (FIGS. 8–10) a filter construction for a return path filter called a "step attenuator." This construction is also shown in FIG. 2 herein, as representing the prior art construction for this type of filter. While simplification was achieved in U.S. Pat. No. 5,745,838, the construction still required two major o-rings around the male and female terminal caps and an outer housing sleeve (See FIG. 2 herein); and, manual assembly of these parts was still required.

Many diplex, windowed highpass, and return path filters (See, e.g., embodiments shown in FIGS. 1–5 of U.S. Pat. No. 5,745,838), have dual (or "parallel") circuit paths. For example, FIG. 1, herein, shows a simplified step attenuator circuit 10 containing a forward (or highpass) path 12 and a return (or lowpass) path 14. Cascaded or elongated circuit board arrangements such as shown in U.S. Pat. No. 5,770,983 to Zennamo, Jr. et al., U.S. Pat. No. 4,901,043 to Palinkas, U.S. Pat. No. 4,701,726 to Holdsworth, U.S. Pat. No. 4,451,803 to Holdsworth et al., U.S. Pat. No. 3,579,156 to Parfitt, and U.S. Pat. No. 3,065,434 to Calderhead, are not optimum platforms for such dual path filters. A more optimum platform would be to have two circuit boards disposed in a parallel arrangement.

U.S. Pat. No. 5,278,525 to Palinkas discloses parallel circuit boards for a CATV notch filter (or "trap"), rather than for a dual path filter. The construction includes a considerable number of extra parts, such as an isolation shield, circuit board housings, tuning screw housings, o-rings, and an outer housing sleeve.

In most CATV applications, the filters are installed in an outdoor environment. Thus, it is important that the filter construction be moisture resistant. Efforts to make filters moisture resistant have included enclosing the filter in an outer housing sleeve and employing o-rings between the filter and the outer housing sleeve. See, e.g., U.S. Pat. No. 5,745,838 to Tresness et al., U.S. Pat. No. 5,278,525 to Palinkas, U.S. Pat. No. 4,701,726 to Holdsworth, and U.S. Pat. No. 4,451,803 to Holdsworth et al. Such an approach requires the additional parts and expense of o-rings and outer housing sleeves, and may require manual assembly of such parts.

A prime path for moisture penetration into the filter is through the terminal fittings or connectors. While efforts to prevent moisture penetration through filter connectors (such as disclosed in U.S. Pat. No. 5,278,525 to Palinkas) have been satisfactory, there remains a need to improve moisture resistance through these connector paths.

Another consideration in CATV filter construction is to establish a good and reliable electrical ground between the filter circuit or circuits and the filter housing. Electrical ground has been established by soldering or fitting isolation shields or blocks between the circuit boards and the filter housing, or by soldering wires or leads between the circuit board and housing. See, for example, U.S. Pat. No. 4,701,726 to Holdsworth. However, such methods usually require additional components or manual assembly steps.

OBJECTS AND SUMMARY OF THE INVENTION

It is therefore an object of the present invention to provide an electronic filter construction that avoids the limits and problems associated with the prior art.

It is another object of the present invention to provide an electronic filter construction that is more suitable for automated assembly than previous filter constructions.

It is a further object of the present invention to provide an electronic filter construction that requires less parts than previous filter constructions.

It is still another object of the present invention to reduce material and labor costs associated with the assembly of an electronic filter;

It is still a further object of the present invention to reduce the size and weight of an electronic filter;

It is yet another object of the present invention to provide an electronic filter construction that is optimum for dual (or parallel) path filter circuits;

It is yet a further object of the present invention to provide an electronic filter construction that establishes an effective and reliable ground connection between the filter's circuitry and the filter housing; and It is still yet another object of the present invention to provide an electronic filter construction that has improved moisture resistance.

These and other objects are attained in accordance with the present invention wherein there is provided a filter assembly, comprising (1) a first terminal cap, (2) a second terminal cap, (3) a first circuit board, and (4) a second circuit board. The first and second terminal caps are disposed along a longitudinal axis in opposing relation to each other. The terminal caps are physically and electrically coupled to each other.

Both circuit boards are physically coupled to the first terminal cap. The first circuit board includes—(i) front and rear surfaces, (ii) a first filter circuit located on either or both of the front and the rear surfaces, (iii) a ground contact electrically coupled to the first filter circuit and to said first terminal cap, and (iv) a first filter terminal coupled to the first circuit. The second circuit board includes—(i) front and rear surfaces, (ii) a second filter circuit located on either or both of the front and the rear surfaces, (iii) a ground contact electrically connected to the second filter circuit and to said first terminal cap, and (iv) a second filter terminal coupled to the second circuit. The first and second circuits are electrically coupled to each other, and each circuit is electrically coupled to the first terminal cap via the ground contacts such that the circuits have a common ground through the first terminal cap.

The first and second circuit boards are positioned substantially parallel to each other and to the longitudinal axis, between the terminal caps. The front surface of the first circuit board substantially faces the front surface of the second circuit board. The first and second terminals extend into and are operatively supported inside the first and second terminal caps, respectively.

In a modified embodiment, the filter assembly of the present invention may include only a single circuit board physically coupled to the first terminal cap. In such an embodiment, the single circuit board would include—(i) front and rear surfaces, (2) a filter circuit located on either or both of the front and rear surfaces, (iii) a ground contact electrically coupled to the filter circuit and to the first terminal cap, and (iv) first and second filter terminals electrically coupled to the filter circuit. The filter circuit is electrically coupled to the first terminal cap via the ground lead, such that the circuit is grounded through the first terminal cap. The single circuit board is positioned substantially parallel to the longitudinal axis, between the terminal caps. The first and second terminals extend into and are operatively supported inside the first and second terminal caps, respectively.

In an alternative embodiment, a filter assembly is provided, which comprises—(1) first and second terminal caps, (2) a filter circuit, (3) first and second filter terminals, (4) first and second sealing members, and (5) an o-ring. The first and second terminal caps are arranged in opposing relation to each other. The first cap is directly connected to the second cap to form a filter housing which defines an interior volume. The first cap contains an external groove, and the connection between the first and second caps is substantially sealed by solder received in the groove. The caps contain first and second terminal passages, respectively, between the interior volume and the exterior of the filter assembly.

A filter circuit is mounted inside the filter housing. The filter terminals are electrically coupled to the filter circuit. The first and second terminals extend through and are operatively supported inside the first and second terminal passages, respectively. The first sealing member is secured in and substantially closes the first terminal passage. The first sealing member contains a hole through which the first terminal tightly fits. The second sealing member is secured in and substantially closes the second terminal passage. The second sealing member contains a hole through which the second terminal tightly fits. The o-ring is seated inside the second terminal passage, between the second sealing member and the second terminal cap.

BRIEF DESCRIPTION OF THE DRAWING

Further objects of the present invention will become apparent from the following description of the preferred embodiment with reference to the accompanying drawing, in which:

FIG. 1 is a schematic diagram of a dual-path filter circuit;

FIG. 2 is a longitudinal cross-sectional view of a filter constructed in accordance with the teachings of the prior art;

FIG. 3A is a longitudinal cross-sectional view of a filter constructed in accordance with the present invention;

FIG. 3B is an enlarged cross-sectional view of the circled area in FIG. 3A;

FIG. 5 is an exploded view showing a modification to the filter of FIG. 4; and

FIG. 6 is an exploded view showing another modification to the filter of FIG. 4.

DETAILED DESCRIPTION OF THE PREFERRED EMBODIMENT

Figure 4:
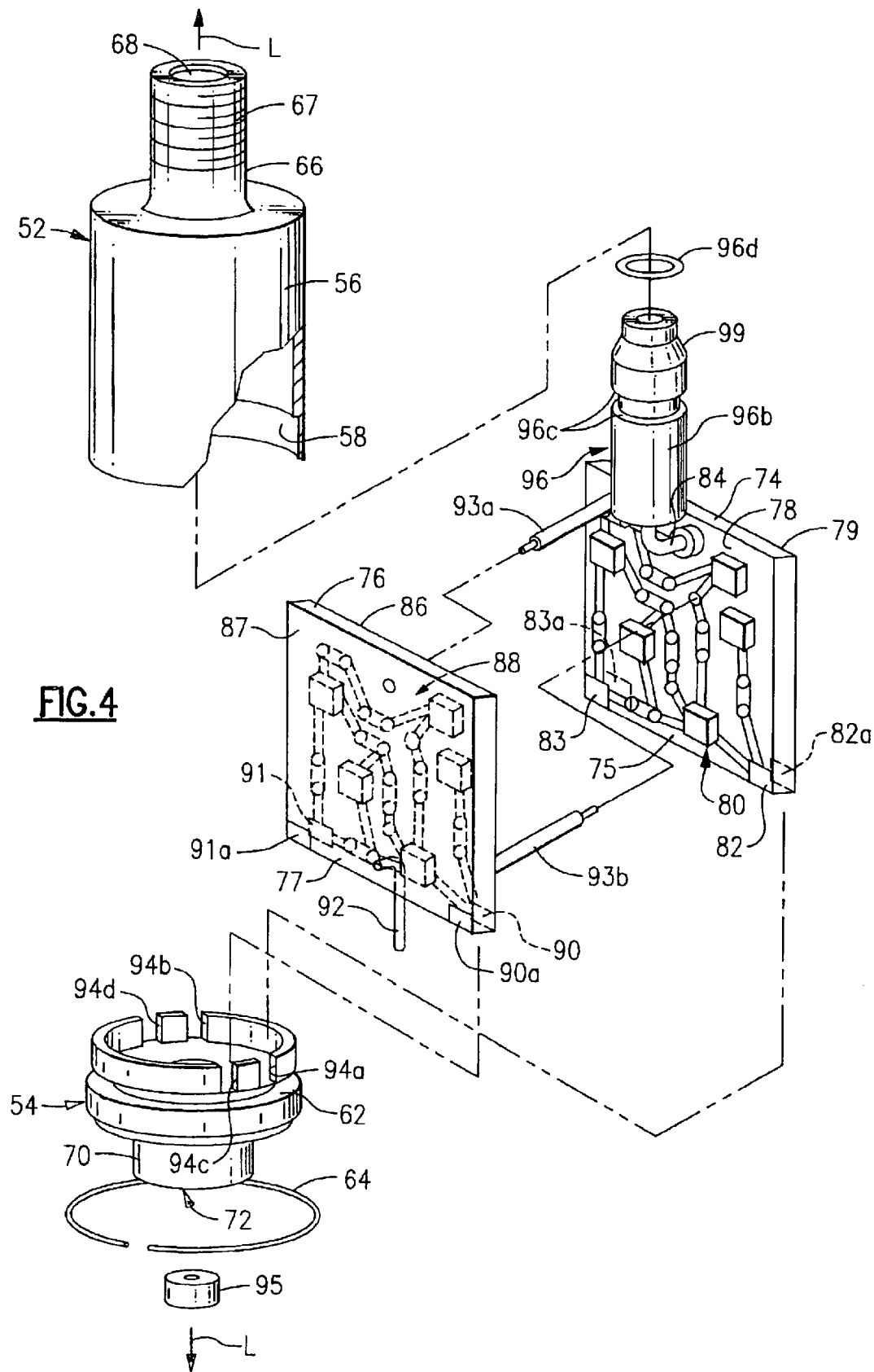
FIG. 4 is an exploded view of the filter shown in FIG. 3A.

The filter assembly of the present invention is especially suited for dual (or parallel) path filter circuits. As understood in the art, dual path circuits include at least two separate circuit paths. Examples of dual path filters are diplex, windowed highpass, and some step attenuator filters. Referring now to FIG. 1, there is shown a schematic of a dual path filter circuit 10, having a highpass circuit path 12 and a lowpass circuit path 14. Circuit 10 is a simplified version of a step attenuator circuit described in U.S. Pat. No. 5,745,838 to Tresness et al., incorporated herein by reference. The present invention is not limited to filter assemblies for any particular filter circuit. Circuit 10 is presented only as an example of a dual path circuit. An understanding of circuit 10 is not necessary for an understanding of the present invention.

FIG. 2 shows a sectional view of a conventional filter construction. The construction includes a female terminal cap 16, a male terminal cap 18, an elongated circuit board 20, a female terminal 22, a male terminal 24, o-rings 26 and 28, and an outer housing sleeve 30. Terminal caps 16 and 18 are soldered together by way of a solder ring 32. Female terminal 22 is connected to a female connector assembly 34 which includes a sealing member 36. Male terminal 24 extends through an internally threaded fitting 38 contained in cap 18. Terminal 24 is tightly fitted through a sealing wafer 40 secured inside cap 18. The filter shown in FIG. 2 is of the type that does not require shielding or tunable filter components. As a result, low profile, surface mounted filter components 44 are used. It is apparent from FIG. 2 that this conventional construction produces an enormous amount of wasted internal space, and the elongated shape of circuit board 20 constrains efforts to reduce the length of the filter.

The conventional filter construction of FIG. 2 is contrasted markedly by the filter construction of the present invention, shown in FIG. 3A. FIG. 3A depicts the preferred embodiment of the present invention. It does not include the outer housing sleeve and accompanying o-rings. The elimination of these parts simplifies the assembly and allows the filter manufacturer to adopt a more automated assembly process.

The preferred construction will now be described in detail with reference to FIGS. 3A, 3B and 4. A filter 50 includes a female terminal cap 52 and a male terminal cap 54. Caps 52 and 54 are disposed along a longitudinal axis L, in opposing relation to each other. Caps 52 and 54 are made of any suitable conductive metal typically used in the filter industry. Cap 52 includes a cylindrical portion 56 having an extension or crimping sleeve 58. Cylindrical portion 56 extends to cap 54, and sleeve 58 is crimped around cap 54, to form a filter housing with an interior volume 60 (FIG. 3A). Cap 54 contains an external circumferential groove 62

(FIGS. 3A and 4). Caps 52 and 54 are sealed together using a solder ring 64 received in groove 62. A circumferential solder joint is established with ring 64, by way of induction soldering. The solder joint also establishes a good electrical ground connection between caps 52 and 54. Induction soldering is preferred because it can be implemented as an automated assembly step. As a result of the above-described crimping and soldering, a secure physical and electrical connection is established between caps 52 and 54.

Female terminal cap 52 includes a fitting portion 66 containing external threads 67 and a terminal passage 68. Male terminal cap 54 includes a fitting portion 70 containing internal threads 71 and a terminal passage 72. Passages 68 and 72 each establish a passageway between interior volume 60 and the exterior of filter 50.

As shown in FIG. 3A, a pair of filter circuit boards 74, 76 are enclosed in interior volume 60. Circuit boards 74, 76 are arranged substantially parallel to each other and to longitudinal axis L. In this disclosure and in the claims, the term "parallel" is not intended to mean precisely parallel. The term includes orientations that may produce acute angles between the circuit boards.

As best shown in FIG. 4, circuit board 74 includes—(i) front and rear surfaces 78, 79, (ii) a filter circuit 80 located on front surface 78, (iii) a pair of ground contacts 82, 83 electrically connected to circuit 80, and (iv) a terminal 84 electrically coupled to circuit 80. Circuit board 76 includes—(i) front and rear surfaces 86, 87, (ii) a filter circuit 88 located on front surface 86, (iii) a pair of ground contacts 90, 91 electrically connected to circuit 88, and (iv) a terminal 92 electrically coupled to circuit 88. It is preferred that another, corresponding pair of ground contacts be located on the rear surfaces of boards 74, 76, respectively (see corresponding contacts 82a, 83a and 90a, 91a in FIG. 4). These corresponding pairs of contacts are likewise electrically connected to their respective filter circuits (80, 88). Circuit 80 is connected to circuit 88 by way of jumper wires 93a, 93b (FIG. 4), to form a complete filter circuit (such as shown in FIG. 1). Circuits 80, 88 are preferably implemented with all surface mounted filter components, including fixed-tuned chip (ceramic medium) inductors and/or ferrite core inductors.

Dual filter circuit 10 (FIG. 1) can be neatly arranged on circuit boards 74, 76, as indicated by the broken lines in FIG. 1. As represented in FIG. 1, circuit board 74 contains circuit path 14 which is embodied in circuit 80, and circuit board 76 contains circuit path 12 which is embodied in circuit 88. These paths are joined together by jumper wires 93a, 93b (FIG. 1). It is to be noted that the present invention is not limited to dual path circuits or to the separation of dual circuit paths on respective circuit boards. Any operable arrangement may be employed. When we refer to a "filter circuit" or "circuit" on a circuit board, in this disclosure and in the claims, it is intended to mean any arrangement of a circuit component or circuit components, whether or not constituting a complete or identifiable filter circuit. The example presented in this disclosure is merely to illustrate the suitability of the parallel circuit board arrangement (of the present invention) to a dual path circuit.

Circuit boards 74, 76 are mounted directly to male terminal cap 54. As best shown in FIG. 4, circuit boards 74, 76 have mating ends 75, 77, respectively, and the ground contacts are located at the mating ends. Terminal cap 54 contains two pairs of opposed notches 94a, 94b and 94c, 94d. For the purpose of this disclosure and the claims, the term "groove" shall include its normally intended meanings and, in addition, it shall include notch pairs, such as notch pairs 94a, 94b and 94c, 94d. Thus, e.g., notch pair 94a, 94b may be properly referred to herein as groove 94a, 94b. Grooves 94a, 94b and 94c, 94d are configured to receive, in a tight press fit, the mating ends of circuit boards 74, 76, respectively. This tight press fit secures the circuit boards in position.

Circuits 80, 88 are electrically coupled to terminal cap 54 via the ground contacts, and thus establish a common electrical ground for circuits 80, 88. Ground contacts 82, 82a and 83, 83a are in registration and direct contact with notches 94a and 94b, respectively, and ground contacts 90, 90a and 91, 91a are in registration and direct contact with notches 94c and 94d, respectively. Each of the ground contacts is coated with solder when circuit boards 74, 76 are produced. The solder coating ensures a tight fit between the contacts and the notches. In fact, during assembly, the some of the solder is sheared off during insertion of boards 74, 76 into notches process 94a, 94b and 94c, 94d. The ground contacts are soldered to the notches by induction soldering (another automated assembly step). This arrangement establishes a good ground connection between the circuit boards and cap 54.

Terminal 92 is a male connector terminal which extends through and is operatively supported inside terminal passage 72. A potting wafer 95, made of low density polyethylene, is inserted into and substantially closes off terminal passage 72. Wafer 95 contains an open bore through which terminal 92 tightly fits. Once installed, wafer 95 seals passage 72, substantially preventing moisture from entering filter 50 through passage 72.

Terminal 84 includes a female terminal assembly 96 which extends through and is operatively supported inside terminal passage 68. Terminal assembly 96 includes a female connector element or collet terminal 96a, a polypropylene insulator 96b containing an external o-ring groove 96c (FIG. 4), and an o-ring 96d seated in groove 96c. Assembly 96 is inserted into and substantially closes off terminal passage 68. Insulator 96b and o-ring 96d, together, seal passage 68, substantially preventing moisture from entering the filter between passage 68 and insulator 96b. Insulator 96b contains an open bore through which collet terminal 96a tightly fits.

As shown in FIG. 3B, collet terminal 96a has a pair circumferential (360°), protruding barbs or ribs 98. Collet 96a is press fitted through the bore of insulator 96b, causing barbs 98 to penetrate and anchor into insulator 96b (FIG. 3B). "Penetration" of barbs 98 may or may not include breaking into the insulator material—typically, the barbs will penetrate the insulator by deforming the insulator material. The barbs, and their penetration into the insulator, help prevent moisture from entering filter 50, between the bore of insulator 96b and collet 96a.

As shown in FIGS. 3B and 4, insulator 96b has a cone-shaped nose 99, which allows o-ring 96d to be easily slipped over the insulator and seated in groove 96c. This cone-shape allows o-ring 96d to be installed on the insulator by an automated assembly step. In some filter constructions, it may be preferable to have collet 96a extend through the insulator to the point where it is flush with an insulator face 96e (See FIG. 3B). The construction, as above-described, may eliminate the need for potting material inside the filter, in most applications.

Referring now to FIG. 5, there is shown a modification to the embodiment of FIG. 4. Like parts are indicated by like reference numbers. The modification concerns the placement of printed circuit inductors on the rear surface of each circuit board. As shown in FIG. 5, circuits 180, 188 each include a pair of printed inductors 180a, 180b and 188a, 188b, respectively, etched on respective rear surfaces 179 and 187. Inductors 180a, 180b and 188a, 188b may serve, for example, as inductors L3, L4 and L1, L2, respectively, in the circuit shown in FIG. 1. In this embodiment, the capacitors of circuits 180, 188 would remain on the front surfaces of circuit boards 174, 176. The embodiment of FIG. 5 is otherwise the same as the embodiment of FIGS. 3A, 3B and 4.

Referring now to FIG. 6, there is shown another modification of the embodiment of FIG. 4. Like parts are indicated by like reference numbers. In some applications, it may be desirable to have a certain degree of electromagnetic shielding between circuit boards. This can be achieved by locating the filter circuits on the rear surfaces of the circuit boards and locating ground planes on the front surfaces of the boards. As shown in FIG. 6, circuits 280, 288 are located on rear surfaces 279, 287, respectively, and ground planes 281, 289 are located on the front surfaces of boards 274, 276, respectively. The ground planes provide shielding between circuits 280, 288. Ground planes 281, 289 are grounded by their direct physical contact with notches 294a, 294b and 294c, 294d, respectively, when boards 274, 276 are seated in the notches. Thus, separate ground contacts are not necessary on the front surfaces of the boards. As shown in FIG. 6, ground contacts 282a, 283a and 290a, 291a are located on the rear surfaces of boards 274 and 276, respectively.

A circular opening 281a is contained in ground plane 281 to allow terminal 284 to be connected to board 274 without shorting to ground. A similar opening is provided in ground plane 289 for terminal 292. Openings are also contained in the ground planes to accommodate jumper wires 293a, 293b. The embodiment of FIG. 6 is otherwise the same as the embodiment of FIGS. 3A, 3B and 4.

While the preferred embodiment of the invention has been particularly described in the specification and illustrated in the drawing, it should be understood that the invention is not so limited. Many modifications, equivalents, and adaptations of the invention will become apparent to those skilled in the art without departing from the spirit and scope of the invention.

What is claimed is:

1. A cable TV electronic filter assembly, comprising:
   a generally cylindrical conductive housing having first and second cable connectors in opposed relation to each other along a longitudinal axis, said housing containing an interior volume;
   first and second circuit board surfaces, in superposed relation to each other, engaging said filter housing within the interior volume, said first and said second surfaces facing away from each other in opposite directions and being substantially parallel to the longitudinal axis;
   first and second cable TV filter circuits mounted on said first and said second circuit board surfaces, respectively, said first and said second circuits being electrically coupled to each other;
   a ground plane disposed between said first and said second circuit board surfaces in substantially parallel relation to the longitudinal axis, said ground plane contacting said filter housing within the interior volume such that a common electrical ground is established between said housing and said ground plane; and
   first and second electrical terminals coupled to said first and said second filter circuits, respectively, said first terminal extending into and being operatively supported inside the first cable connector, and said second terminal extending into and being operatively supported inside the second cable connector.

2. The cable TV electronic filter assembly of claim 1, wherein said first circuit board surface is a rear surface of a first circuit board and said second circuit board surface is a rear surface of a second circuit board, said first and said second circuit boards engaging said filter housing within the interior volume.

3. The cable TV electronic filter assembly of claim 2, wherein said ground plane is located on a front surface of said first circuit board.

4. The cable TV electronic filter assembly of claim 2, wherein said ground plane is located on a front surface of said second circuit board.

5. The cable TV electronic filter assembly of claim 3, further comprising a second ground plane located on a front surface of said second circuit board.

6. The cable TV electronic filter assembly of claim 1, wherein said filter housing contains a plurality of grooves within the interior volume, said first and said second circuit board surfaces engaging said plurality of grooves.

7. The cable TV electronic filter assembly of claim 6, wherein said filter housing includes a male terminal cap, said plurality of grooves being located in the male terminal cap.

* * * * *